United States Patent
Bartsch et al.

(10) Patent No.: US 7,986,040 B2
(45) Date of Patent: Jul. 26, 2011

(54) METHOD OF REDUCING EROSION OF A METAL CAP LAYER DURING VIA PATTERNING IN SEMICONDUCTOR DEVICES

(75) Inventors: Christin Bartsch, Stolpen (DE); Daniel Fischer, Dresden (DE); Matthias Schaller, Moritzburg (DE)

(73) Assignee: Advanced Micro Devices, Inc., Austin, TX (US)

( * ) Notice: Subject to any disclaimer, the term of this patent is extended or adjusted under 35 U.S.C. 154(b) by 237 days.

(21) Appl. No.: 12/397,661

(22) Filed: Mar. 4, 2009

(65) Prior Publication Data

US 2009/0273086 A1     Nov. 5, 2009

(30) Foreign Application Priority Data

Apr. 30, 2008  (DE) .......................... 10 2008 021 568

(51) Int. Cl.
*H01L 23/522* (2006.01)
(52) U.S. Cl. .. 257/751; 257/758; 257/762; 257/E23.142
(58) Field of Classification Search .................. 257/758, 257/E23.142, E21.215, 751, 774, 762; 438/754, 438/694
See application file for complete search history.

(56) References Cited

U.S. PATENT DOCUMENTS

| | | | |
|---|---|---|---|
| 6,380,075 B1 * | 4/2002 | Cabral et al. | 438/637 |
| 6,528,409 B1 | 3/2003 | Lopatin et al. | 438/618 |
| 6,680,247 B2 * | 1/2004 | Ueno | 438/637 |
| 6,756,672 B1 | 6/2004 | You et al. | 257/751 |
| 6,949,457 B1 | 9/2005 | Fiordalice et al. | 438/627 |
| 7,361,589 B2 * | 4/2008 | Cunningham | 438/639 |
| 2003/0040192 A1 | 2/2003 | Kanegae | 438/710 |
| 2003/0109129 A1 | 6/2003 | Saito et al. | 438/627 |
| 2004/0238961 A1 | 12/2004 | Cunningham | 257/758 |
| 2005/0127511 A1 | 6/2005 | Yang et al. | 257/758 |
| 2006/0118962 A1 | 6/2006 | Huang et al. | 257/760 |
| 2006/0163739 A1 | 7/2006 | Komai et al. | 257/762 |
| 2006/0264030 A1 | 11/2006 | Fujiki | 438/622 |
| 2007/0032062 A1 | 2/2007 | Lee et al. | 438/597 |
| 2007/0077761 A1 | 4/2007 | Lehr et al. | 438/687 |
| 2007/0224855 A1 | 9/2007 | Lee et al. | 439/82 |

OTHER PUBLICATIONS

Translation of Official Communication from German Patent Office for German Patent Application No. 10 2008 021 568.6 dated Oct. 24, 2008.

* cited by examiner

*Primary Examiner* — Roy K Potter
(74) *Attorney, Agent, or Firm* — Williams, Morgan & Amerson

(57) ABSTRACT

During the patterning of via openings in sophisticated metallization systems of semi-conductor devices, the opening may extend through a conductive cap layer and an appropriate ion bombardment may be established to redistribute material of the underlying metal region to exposed sidewall portions of the conductive cap layer, thereby establishing a protective material. Consequently, in a subsequent wet chemical etch process, the probability for undue material removal of the conductive cap layer may be greatly reduced.

8 Claims, 3 Drawing Sheets

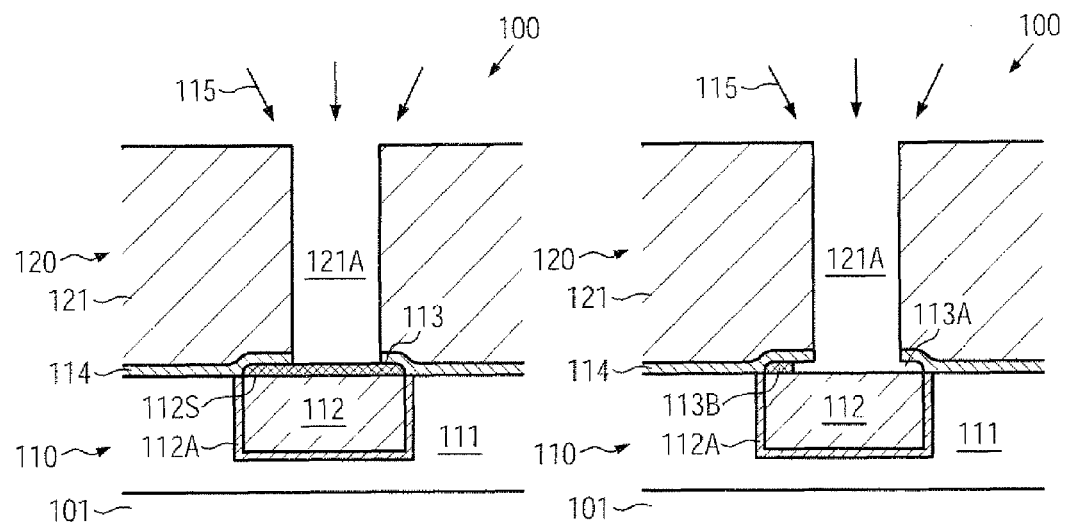
FIG. 1a
(prior art)
FIG. 1b
(prior art)
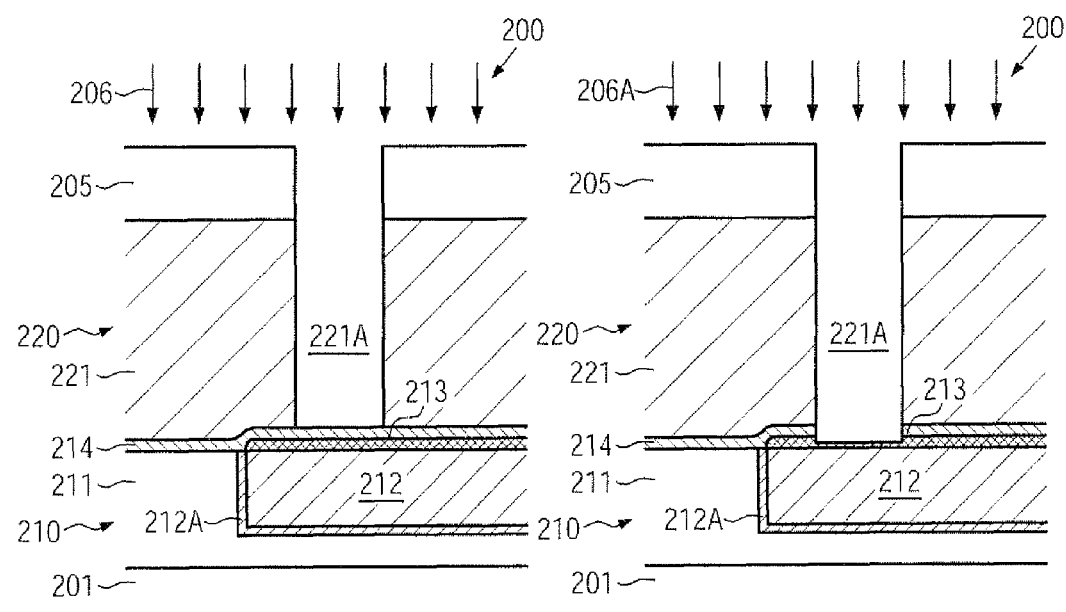
FIG. 2a
FIG. 2b

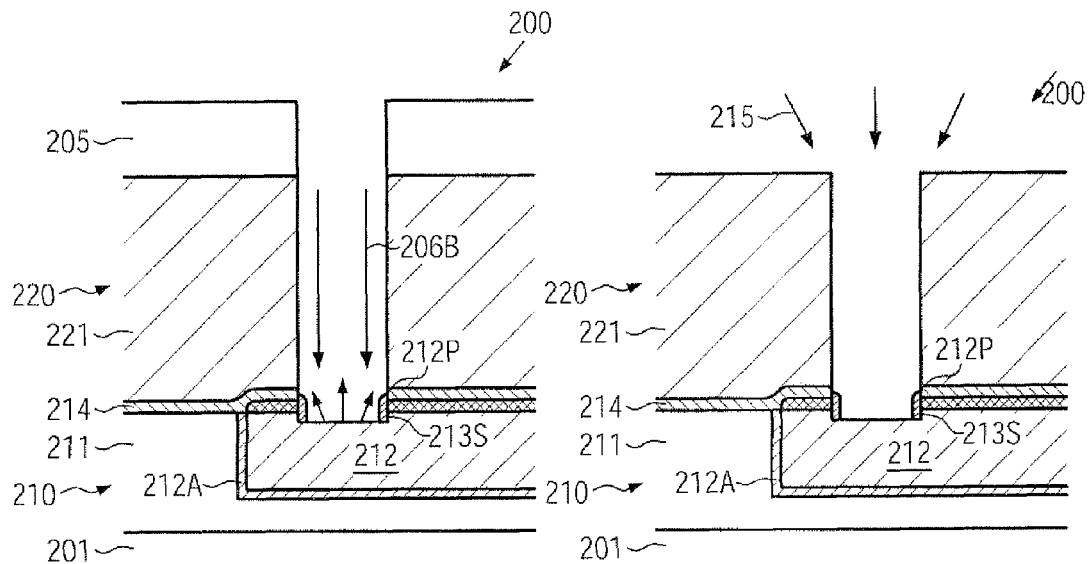
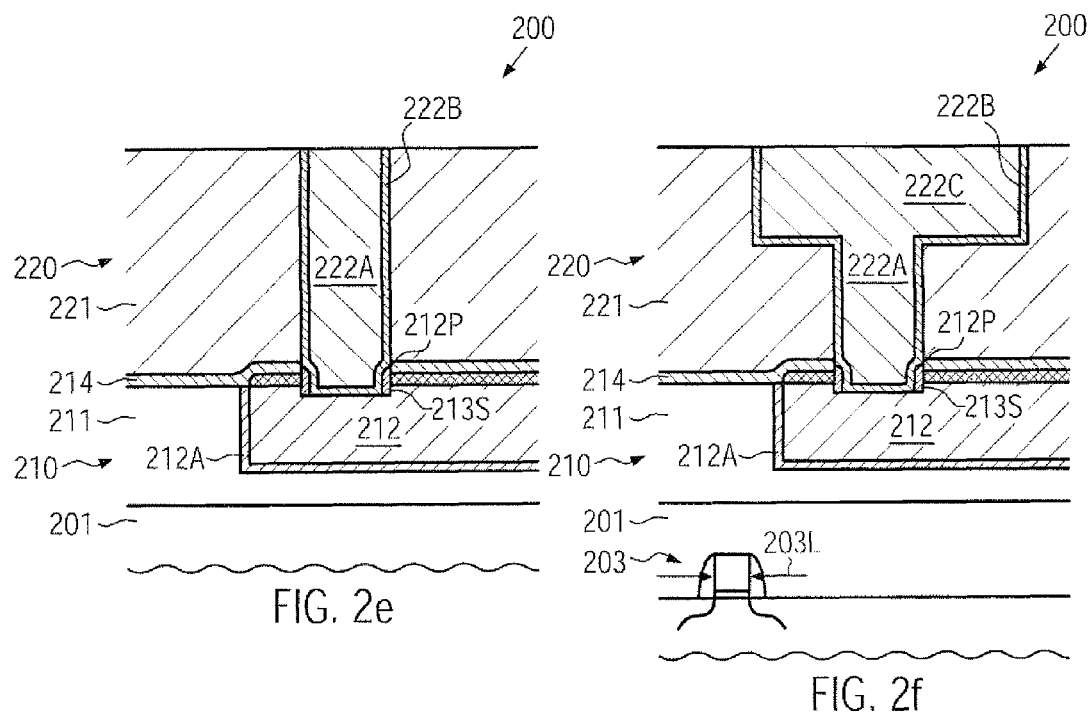

METHOD OF REDUCING EROSION OF A METAL CAP LAYER DURING VIA PATTERNING IN SEMICONDUCTOR DEVICES

BACKGROUND OF THE INVENTION

1. Field of the Invention

Generally, the present disclosure relates to the formation of microstructures, such as advanced integrated circuits, and, more particularly, to the formation of conductive structures, such as copper-based metallization layers, and techniques to reduce electromigration during operation.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area as typically the number of interconnections required increases more rapidly than the number of circuit elements. Thus, usually a plurality of stacked "wiring" layers, also referred to as metallization layers, is provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines, which may even increase with every new device generation.

Advanced integrated circuits, including transistor elements having a critical dimension of 0.05 μm and even less, may, therefore, typically be operated at significantly increased current densities of up to several kA per cm$^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced mass transport in metal lines and vias, also referred to as "electromigration." Electromigration is caused by momentum transfer of electrons to the ion cores, resulting in a net momentum in the direction of electron flow. In particular at high current densities, a significant collective motion or directed diffusion of atoms may occur in the interconnect metal, wherein the presence of respective diffusion paths may have a substantial influence on the displaced amount of mass resulting from the momentum transfer. Thus, electromigration may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.1 μm or less, may require significantly reduced cross-sectional areas of the metal lines and, thus, increased current densities, which may render aluminum less attractive for the formation of metallization layers.

Consequently, aluminum is being replaced by copper and copper alloys, a material with significantly lower electrical resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability for significant material transport at the interface, which is typically a critical region in view of increased diffusion paths. Currently, tantalum, titanium, tungsten and their compounds with nitrogen and silicon and the like, are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less in combination with trenches having a width ranging from 0.1 μm to several μm. Electrochemical deposition processes for copper are well established in the field of electronic circuit board fabrication. However, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been made in investigating the degradation of copper interconnects, especially in combination with low-k dielectric materials having a relative permittivity of 3.1 or even less, in order to find new materials and process strategies for forming copper-based lines and vias with a low overall permittivity. Although the exact mechanism of electromigration in copper lines is still not quite fully understood, it turns out that voids positioned in and on sidewalls and especially at interfaces to neighboring materials may have a significant impact on the finally achieved performance and reliability of the interconnects.

One failure mechanism, which is believed to significantly contribute to a premature device failure, is the electromigration-induced material transport, particularly along an interface formed between the copper and a dielectric cap layer, which may be provided after filling in the copper material in the trenches and via openings, the sidewalls of which are coated by the conductive barrier materials. In addition to maintaining copper integrity, the dielectric cap layer may usually act as an etch stop layer during the formation of the via openings in the interlayer dielectric. Frequently used materials are, for example, silicon nitride and silicon carbon nitride, which exhibit a moderately high etch selectivity to typically employed interlayer dielectrics, such as a plurality of low-k dielectric materials, and also suppress the diffusion of copper onto the interlayer dielectric. Recent research results seem to indicate, however, that the interface formed between the copper and dielectric cap layer is a major diffusion path for material transport during operation of the metal interconnect.

Consequently, a plurality of alternatives have been developed in an attempt to enhance the interface characteristics between the copper and the cap layer having the capability of reliably confining the copper and maintaining its integrity. For example, it has been proposed to selectively provide conductive materials on top of the copper-containing region, which may exhibit superior electromigration performance while not unduly reducing the overall resistance of the corresponding metal line. For instance, a compound of cobalt/tungsten/phosphorous (CoWP) has proven to be a promising candidate for conductive cap layers, which may significantly reduce electromigration effects within a corresponding metal line.

Although the compound of cobalt/tungsten/phosphorous provides superior electromigration performance and may be efficiently implemented into the overall process flow for manufacturing complex metallization systems, since this compound may be readily deposited on the basis of selective electrochemical deposition recipes, it turns out, however, that severe defects may be observed during the patterning of vias connecting to metal regions having formed thereon the cobalt/tungsten/phosphorous cap layer, as will be described in more detail with reference to FIGS. 1a-1b.

FIG. 1a schematically illustrates a cross-sectional view of a semiconductor device 100 at an advanced manufacturing stage, i.e., during the manufacturing sequence for forming a metallization system. The semiconductor device 100 comprises a substrate 101, which may include circuit elements (not shown) according to the specific circuit configuration of the device 100. The semiconductor device 100 may further comprise a first metallization level 110 and a second metallization level 120. As previously explained, the metallization layer 110 may comprise a dielectric material 111, for instance in the form of a low-k dielectric material, in which is formed a metal line 112 comprised of copper in combination with a barrier layer 112A, for instance in the form of tantalum nitrite, tantalum and the like. Moreover, a top surface 112S of the metal region 112 has formed thereon a conductive cap layer 113 comprised of the ternary alloy cobalt/tungsten/phosphorous (CoWP). Furthermore, a dielectric etch stop layer 114, for instance in the form of silicon dioxide, silicon carbide, nitrogen-containing silicon carbide and the like, is formed above the dielectric material 111 and partially above the metal line 112 in contact with the conductive cap layer 113. The further metallization layer 120 comprises, in the manufacturing stage shown, a dielectric material 121 of any appropriate composition, in which is formed a via opening 121A, wherein the dielectric material 121 may represent a lower portion of a dielectric layer stack for the layer 120, if a single damascene strategy is considered, or a trench (not shown) may be formed in the upper portion of the dielectric layer 121.

The semiconductor device 100 as shown in FIG. 1a may be formed on the basis of well-established process techniques, including the formation of circuit elements (not shown), followed by the fabrication of an appropriate contact structure above which a plurality of metallization layers, such as the layers 110, 120, may be formed. For this purpose, the dielectric material 111 may be deposited, for instance, by chemical vapor deposition (CVD) and the like, followed by a patterning sequence for forming an appropriate trench in the layer 110, possibly in combination with respective via openings (not shown), depending on the overall process strategy. A respective etch process for forming a via opening will be discussed with reference to the via opening 121A. Next, the barrier layer 112A may be formed and subsequently the copper material may be filled in, for instance, by electroplating, which may possibly require the deposition of an appropriate seed layer. Thereafter, any excess material of the copper and the barrier layer 112A may be removed, for instance, by electrochemical etch techniques, chemical mechanical polishing (CMP) and the like. Subsequently, the exposed surface 112S may be "passivated" by depositing the conductive cap layer 113, thereby also providing the desired strong interface at the surface 112S in view of superior electromigration performance, as previously discussed. The deposition of the CoWP alloy may be accomplished by electroless plating, during which the exposed surface 112S may act as a catalyst material for initiating the electrochemical reaction when exposed to an appropriate electrolyte solution. Thus, a self-aligned deposition mechanism may be obtained, since the deposition is substantially restricted to the exposed copper surface 112S. After depositing a desired thickness, for instance, approximately 10 to 50 nm, the dielectric etch stop layer 114 may be deposited, for instance by CVD, followed by the deposition of the dielectric material 121. Next, a complex patterning sequence may be performed, which finally results in the via opening 121A so as to extend down to and into the dielectric etch stop layer 114, which may finally be opened on the basis of well-established etch recipes.

As is well known, during complex plasma-assisted etch processes, a plurality of etch byproducts may be generated, at least some of which may also deposit on exposed surface areas and which may have to be removed prior to a subsequent deposition of a material, such as a conductive barrier material within the opening 121A. Consequently, respective wet chemical etch recipes 115 may be applied, such as diluted hydrofluoric acid, ammonia peroxide mixtures and the like, which have proven to be efficient recipes for conditioning exposed surface portions prior to the further processing of the device 100. Consequently, during the process 115, an exposed portion of the conductive cap layer 113 may come into contact with a wet chemical etchant, which, however, may result in undue material removal, thereby substantially completely removing the exposed portion of the cap layer 113 and also creating a significant under-etched area adjacent to the via opening 121A.

FIG. 1b schematically illustrates the semiconductor device 100 after the wet chemical cleaning process 115. As illustrated, a significant under-etching 113A may occur, thereby producing respective voids in the layer stack of the metallization system 120, which may thus result in process non-uniformity during the further processing, thereby also degrading overall performance of the via after filling the same with a barrier material and copper. Consequently, significant efforts have been made to substantially avoid the creation of the under-etched areas 113A, for instance, by finding wet chemical etch chemistries for efficiently cleaning the structure after a plasma-assisted etch process, substantially without attacking the cobalt/tungsten/phosphorous alloy. However, respective wet chemical etch chemistries may suffer from reduced efficiency. In other approaches, a further deposition process for forming the CoWP alloy in the under-etched areas 113A may be used, thereby significantly contributing to the overall cycle time due to a further wet chemical deposition step.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and respective semiconductor devices in which the patterning of openings in dielectric materials of metallization layers of sophisticated semiconductor devices may be accomplished on the basis of a highly efficient manufacturing flow, while substantially avoiding undue material removal of conductive cap materials, such as alloys including cobalt, tungsten, phosphorous, or any other appropriate alloy materials, which may be advantageously used in enhancing the electromigration behavior of sophisticated metal lines. For this purpose, a protective material may be efficiently positioned at exposed sidewall portions of the alloy during the patterning of the via opening so that a subsequent wet chemical cleaning process may be performed on the basis of well-established and highly efficient cleaning recipes, substantially without significantly creating undesired voids in the conductive cap material. The protective material may be positioned in a highly local manner, thereby not unduly affecting the overall characteristics of the conductive cap material with respect to the electromigration performance, while also not significantly affecting other device areas, such as exposed dielectric portions of the metallization layer at this manufacturing stage. In some illustrative aspects, an efficient redistribution of material at the bottom of the via opening, for instance by etching through the conductive cap layer, may be accomplished such that the material of the under-lying metal region efficiently covers exposed sidewall portions of the conductive cap layer during the subsequent wet chemical cleaning process. Hence, a high degree of compatibility with conventional process techniques may be maintained, nevertheless providing superior device characteristics.

One illustrative method disclosed herein comprises forming an opening in a dielectric layer so as to extend through a conductive cap layer of a metal region of a metallization layer for a semiconductor device. The method further comprises forming a protection layer at a lower portion of the opening so as to substantially cover a surface area of the conductive cap layer exposed in the opening. Finally, the method comprises performing a wet chemical cleaning process.

A further illustrative method disclosed herein comprises forming a via opening in a dielectric layer of a metallization layer in a semiconductor device, wherein the via opening extends at least into a conductive cap layer formed on a metal region. The method additionally comprises redistributing material at a bottom of the via opening by establishing an ion compartment and performing a wet chemical cleaning process of the redistribution of the material.

One illustrative semiconductor device disclosed herein comprises a metal region formed in a first dielectric layer and a conductive cap layer formed on at least a portion of the metal region. Furthermore, a via extends through a second dielectric layer and through the conductive cap layer and a protective material layer is formed on the sidewall portions of the conductive cap layer within the via. Additionally, the semiconductor device comprises a conductive barrier layer formed on the protective material and on surface portions of the second dielectric layer within the via.

BRIEF DESCRIPTION OF THE DRAWINGS

The disclosure may be understood by reference to the following description taken in conjunction with the accompanying drawings, in which like reference numerals identify like elements, and in which:

FIGS. 1a-1b schematically illustrate cross-sectional views of a semiconductor device during the patterning of a dielectric material for forming a via opening connecting to a copper-containing metal region having formed thereon a CoWP cap layer, according to conventional process strategies;

FIGS. 2a-2e schematically illustrate cross-sectional views of a semiconductor device during various manufacturing stages in forming a via in a metallization level while protecting sidewall portions of the conductive cap layer, according to illustrative embodiments;

FIG. 2f schematically illustrates a cross-sectional view of a semiconductor device having formed therein a metal line and a via connecting to a metal line of a lower lying metallization level and formed in accordance with a dual damascene strategy, according to further illustrative embodiments.

Figure 2G:
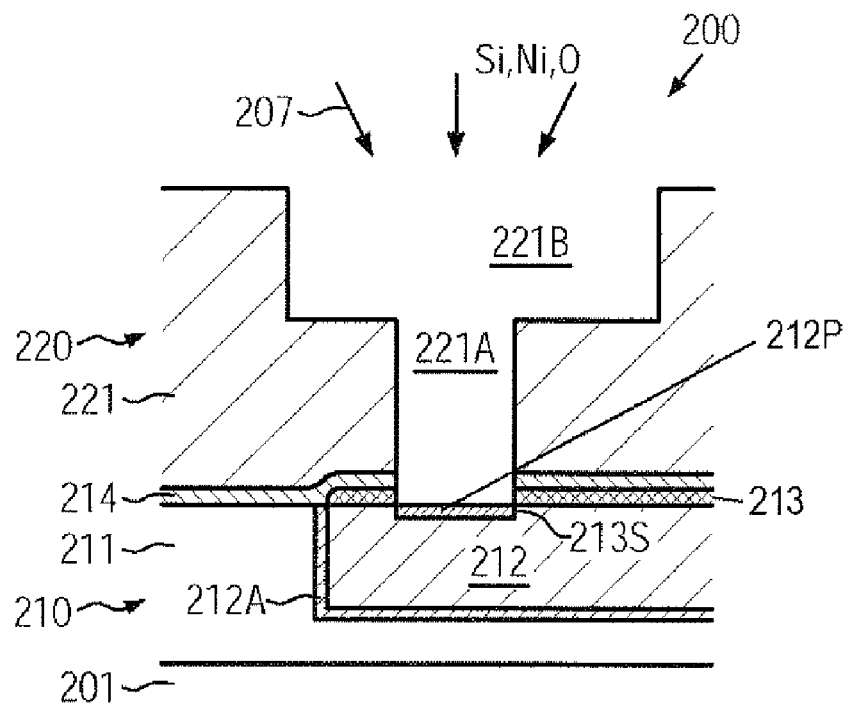
FIGS. 2g-2h schematically illustrate cross-sectional views of a semiconductor device during the patterning of a via opening while introducing an additional material locally at the via bottom, according to still further illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques in which well-established wet chemical etch recipes may be used during the patterning of sophisticated metallization systems by appropriately covering exposed surface areas of a conductive cap layer comprised of alloys, such as ternary alloys, which may typically have a moderately high etch rate in combination with the wet chemical etch recipes. An efficient coverage of exposed surface portions of the conductive cap material may be accomplished, in some illustrative embodiments, by locally providing a material having a significantly higher etch resistance with respect to the cleaning agent, such as the metal of the underlying metal region, which may typically be more noble and may therefore have a less negative electrode potential compared to the material of the conductive cap layer. For this purpose, during the patterning of the via opening, the etch process may be controlled such that the via opening may extend through the conductive cap layer and may expose the material of the metal region, which may then be used as "a material source" for covering the exposed sidewall portion of the via bottom. Consequently, during the etch process and/or in a further process step, the ion bombardment may result in a desired redistribution of material at the via bottom, which may be re-deposited at the sidewall portions, thereby increasingly building up a protective material layer, which may have the desired high etch resistivity with respect to the wet chemical etch recipe. The ion bombardment may also be established on the basis of process parameters resulting in a "sputter" etch process, wherein the material of the exposed metal region may act as the sputter target, from which material may be released and may be re-deposited at lower portions of the via opening. During the ion bombardment, for instance, provided during the anisotropic etch process for etching through the cap layer or during an additional "sputter" step, the process may be controlled such that the redistribution of the material may be substantially restricted to the conductive cap layer and a dielectric etch stop layer, while substantially avoiding a significant deposition of the material on low-k dielectric materials, which may typically be used in sophisticated applications. For this purpose, appropriate process parameters for creating the ion bombardment may be determined, for instance, on the basis of test measurements and the like, so as to appropriately select the layer thickness of the dielectric etch stop layer to provide a desired process margin for redistributing the material under consideration.

For instance, the exposed metal region may comprise a significant amount of copper, which may provide increased etch resistance with respect to a plurality of well-established wet chemical cleaning recipes, while, however, a direct contact or deposition of copper material on low-k dielectric materials may be considered inappropriate. Thus, in this case, a significant deposition of copper material may be suppressed by appropriately adjusting the process parameters and/or a layer thickness of the dielectric etch stop layer. In other illustrative embodiments, a further material may be locally provided at the via bottom, for instance by a surface treatment, ion implantation and the like, to enhance the overall characteristics of the protective material to be distributed onto the lower sidewall portions of the via opening. Hence, the overall characteristics of the protective material that may be deposited on exposed portions of the conductive cap layer may be adjusted to a certain degree in view of etch resistivity, adhesion and the like.

FIG. 2a schematically illustrates a cross-sectional view of a semiconductor device 200 comprising a substrate 201, above which may be formed a device level (not shown) which may represent a semiconductor material, such as a silicon-based material and the like, in and above which a plurality of circuit elements may be formed in accordance with respective design rules. For example, as previously explained, in sophisticated applications, the circuit elements may have critical dimensions of approximately 50 nm and less. Furthermore, additional device levels may be provided, for instance, a contact structure (not shown) designed to connect respective contact areas of the circuit elements with one or more metallization layers 210 in accordance with the specified circuit configuration. The metallization layer 210 may comprise a dielectric material 211, possibly in combination with appropriate cap layers or etch stop materials (not shown). An appropriate material composition for the dielectric material 211 and any respective cap layer may be selected according to similar criteria, as are previously explained with reference to the device 100. Furthermore, the metallization layer 210 may comprise a metal region 212, for instance in the form of a metal line, which may also comprise an appropriate barrier material 212A, as is also previously discussed. Furthermore, a conductive cap layer 213 may be formed on the metal region 212, wherein any appropriate alloy may be used, such as an alloy comprised of cobalt/tungsten/phosphorous, as previously explained. It should be appreciated, however, that any other alloy may be used, as long as an enhanced behavior with respect to electromigration may be achieved.

Moreover, a second metallization layer 220 may be formed above the layer 210, and may comprise a dielectric material 221, wherein, in the embodiment shown, an etch stop layer 214 may be provided, if the etch selectivity of the conductive cap layer 213 is considered inappropriate during an etch process for forming a via opening 221A in the dielectric material 221. Furthermore, an etch mask 205, which may comprise a resist material, an anti-reflective coating (ARC) material and the like, may be formed above the dielectric layer 221 and may have an opening for defining the lateral size of the via opening 221A during an etch process 206.

The semiconductor device 200 as shown in FIG. 2a may be formed on the basis of similar process techniques as are described above with reference to the device 100. For example, the etch mask 205 may be formed in accordance with well-established patterning strategies and well-established process parameters may be used for the anisotropic etch process 206. It should be appreciated that a plurality of patterning regimes may be used for forming vias and trenches in the dielectric material of a metallization layer, such as single damascene techniques, dual damascene techniques and the like. In the following process scheme, it may be referred to as a process for patterning the via opening 221A, and subsequently filling the same with an appropriate conductive material, while a corresponding metal line may be formed in a separate process sequence. In other cases, the via opening and a respective trench may be formed in a patterning sequence and thereafter the filling in of a conductive material may be performed in a common manufacturing process, as will be described later on with reference to FIG. 2f. In still other cases, a combination of single damascene and dual damascene strategy may be used, wherein the via opening may be defined in a separate process sequence and subsequently a respective trench may be formed, while, however, both openings may commonly be filled with a conductive material.

FIG. 2b schematically illustrates the semiconductor device 200 in a further advanced stage, in which an etch process 206A may be performed to etch through the etch stop layer 214, which may have been used as an appropriate etch stop during the etch process 206. The etch process 206A, as shown in FIG. 2b, may be performed in the same etch tool as the process 206 or may be established in a different etch tool, depending on the overall process strategy. For example, after etching through the dielectric layer 221 on the basis of well-established etch chemistries, the etch front may be stopped on or in the etch stop material 214 and subsequently the etch chemistry may be changed to etch through the etch stop layer 214, which may be accomplished on the basis of well-established etch recipes. For instance, the etch stop material 214 may be comprised of silicon nitride, silicon carbide, nitrogen-containing silicon carbide, amorphous carbon or any other appropriate material composition, possibly including a plurality of different material layers, wherein, for each of these materials, well-established etch chemistries may be available. For instance, a fluorine-based etch chemistry may be used in order to efficiently etch through the material 214. During the etch process 206A, the etch front may attack the material of the conductive cap layer 213, however, with a significantly different etch rate, depending on the overall process strategy. As previously discussed with reference to the device 100, typically, the etch process 206A may be stopped within the cap layer 213. In some illustrative embodiments disclosed herein, the etch process 206A may be continued, for instance, based on substantially the same etch chemistry, in order to etch through the cap layer 213 so as to finally expose the metal region 212. In some illustrative embodiments, the degree of ion bombardment during the etch process 206A may be appropriately selected to obtain a sufficient physical component in order to continuously sputter off respective atoms of the material 213 of the exposed surface portion so as to enable a re-deposition of these atoms at lower sidewall portions of the opening 221A. Thus, in some illustrative embodiments, the etch process 206A, at least at the final phase, may be performed on the basis of a pronounced physical component to produce respective species that may re-deposit, thereby forming a corresponding thin layer, which may be used as a "barrier material" when re-sputtering material of the metal region 212.

As previously explained, appropriate parameters with respect to plasma power, bias power and the like may be readily determined on the basis of test runs with a subsequent inspection of the corresponding result of the etch process. For instance, test structures including test via openings of similar or identical design dimensions may be subjected to cross-sectional analysis in order to determine their degree of material redistribution at the bottom of the vias 221A for different test parameters. In other illustrative embodiments, the etch process 206A may be performed on the basis of a typical chemically reactive etch process, i.e., by forming a volatile compound when the components of the etch ambient are brought into contact with the exposed surface portions, when a significant material redistribution at this phase of the etch process 206A may not be desired or when a corresponding material redistribution on the basis of etch recipes with a moderately high amount of reactive components may be considered appropriate.

FIG. 2c schematically illustrates the semiconductor device 200 in an advanced stage, in which, in some illustrative embodiments, an ion bombardment 206B may be performed to increasingly release metal atoms from an exposed surface portion of the metal region 212 after substantially completely etching through the conductive cap layer 213. Consequently, during the process 206B, a protective material 212P may form at sidewall portions 213S of the cap layer 213, wherein the protective material 212P may be substantially comprised of material of the metal region 212, wherein also other components, such as components of the conductive cap layer 213, may be incorporated into the protective material 212P. Typically, the material of the metal region 212 may be more noble compared to the components of the conductive cap layer 213, so that the protective material 212P may have a significantly increased resistance with respect to a wet chemical cleaning process due to significantly less negative electrode potential of the material 212P compared to typically used alloys, such as CoWP. The ion bombardment 206B may be established, as previously explained, on the basis of substantially the same process conditions as may be used in the etch process 206A, while, in other cases, a substantially physically driven removal process may be established, which may also be referred to as a "sputter etch" process, so that an efficient material removal in the region 212 may be established, wherein, however, the corresponding process conditions, such as pressure, temperature, plasma power and bias power, may be selected such that the released material may immediately re-deposit so as to form the protective material 212P.

For example, a respective "sputter" atmosphere may be established on the basis of any appropriate etch chamber by using an appropriate species, such as argon and the like, while, in other illustrative embodiments, the supply of respective reactive components may be discontinued, which may have previously been used during the etch process 206A and the like, when the corresponding rate of redistribution of material may be considered appropriate. Also, in this case, appropriate process parameters may be readily determined, for instance, by using approved process recipes, as may also be used during the deposition of conductive barrier materials and a corresponding re-sputtering of these materials, as may frequently be used in sophisticated patterning regimes. As previously discussed, in some illustrative embodiments, a pronounced ion bombardment may also be established during the process 206A, thereby forming a "barrier layer," on which the protective material 212P may be increasingly deposited. For example, a respective layer of material may "spread" across a lower portion of the via opening 221A, for instance above the etch stop layer 214, thereby providing a barrier with respect to the dielectric material 221 for the subsequent release and redistribution of the protective material 212P, which may be substantially comprised of material of the metal region 212, which, in turn, may include copper, which is known to readily diffuse in a plurality of low-k dielectric materials. Consequently, in this case, the control of the height level for redistributing the protective material 212P may be less critical, even if a direct contact of material of the metal region 212 with the dielectric material 221 may be considered inappropriate.

FIG. 2*d* schematically illustrates the semiconductor device 200 in a further advanced manufacturing stage, in which a wet chemical cleaning process 215 may be performed, wherein well-established recipes may be used, such as diluted hydrofluoric acid (HF), a mixture of ammonia and hydrogen peroxide and the like. Due to the increased etch resistivity of the protective material 212P, an exposure of the sidewall portions 213S, which may be covered by the protective material 212P, may be efficiently suppressed, thereby significantly reducing the probability of creating voids and other irregularities, as previously described with reference to the conventional process strategy. Consequently, after the wet chemical cleaning process 215, the further processing may be continued by the deposition of an appropriate barrier material, without requiring an additional deposition process for refilling any voids of the conductive cap layer, as may frequently be required in conventional strategies.

FIG. 2*e* schematically illustrates the semiconductor device 200 in a further advanced manufacturing stage. As illustrated, a via 222A is formed in the opening 221A and may comprise an appropriate metal, such as copper, in combination with a barrier material 222B, which may also cover at least a portion of the protective material 212P.

FIG. 2*f* schematically illustrates the semiconductor device 200 according to further illustrative embodiments, in which the via 222A and a metal line 222C may be formed in accordance with a dual damascene strategy, in which a trench opening and the via opening 221A may be formed in the dielectric material 221 and may be filled in a common process sequence. For this purpose, in some cases, the via opening 221A may be formed in accordance with the same process techniques, as previously described with reference to FIG. 2*a*, wherein a respective lithography process may be subsequently performed to provide a trench mask for patterning a trench opening. In other cases, an upper portion of the via opening 221A may be formed first and subsequently a trench opening and the lower portion of the via opening 221A may be formed in a common etch process, while, in still other approaches, the trench opening may be formed first followed by the patterning of the via opening 221A. Irrespective of the process sequence used, upon opening the etch stop layer 214 or upon exposing the conductive cap layer 213, the corresponding etch processes 206A and/or 206B may be performed to provide the protective material 212P at the exposed sidewall portions of the conductive cap layer 213, as previously explained. In some illustrative embodiments, the protective material 212P may be formed so as to be restricted to the cap layer surface 213S of the cap layer 213 and a sidewall surface of the etch stop layer 214, so as to substantially avoid a direct contact of the material 212P with the dielectric material 221. In other cases, the material 212P may extend above the etch stop layer 214, when the contact of the material of the metal region 212 with the material 221 is considered less critical. Hence, irrespective of the patterning regime used, an efficient overall process flow may be established while significantly reducing the probability of creating defects due to a missing portion of the conductive cap layer 213. Consequently, metallization layers, such as the metallization layer 220, may be formed in sophisticated semiconductor devices, which may comprise transistor elements, such as the transistor 203 having a gate length 203L of approximately 50 nm and less, thereby contributing to an enhanced production yield in the metallization level, while nevertheless providing a high degree of compatibility with conventional strategies.

Figure 2H:
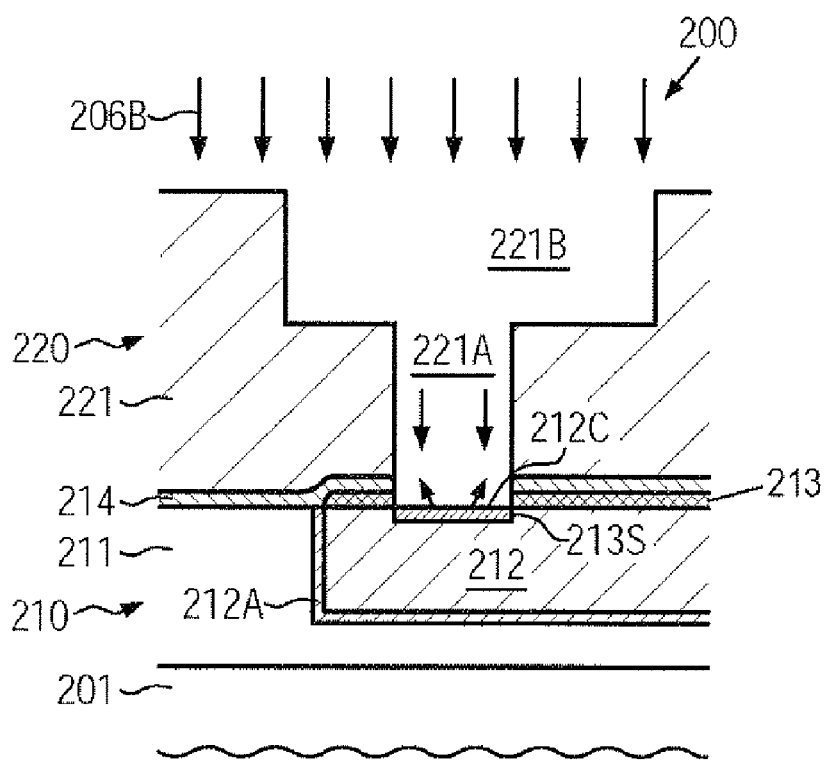

With reference to FIGS. 2*g*-2*h*, further illustrative embodiments will now be described in which, in addition to an efficient redistribution of material from the metal region 212, additional material species may be incorporated at the bottom of the via.

FIG. 2*g* schematically illustrates the semiconductor device 200 with the via 221A formed in the dielectric layer 221 so as to extend through the etch stop layer 214 and the conductive cap layer 213. Furthermore, a trench 221B may be formed in the upper portion of the dielectric layer 221. For example, the trench 221B may be formed in accordance with process techniques, as previously described. During etching through the layers 214 and 213, appropriate process conditions may have been established, as previously explained, when a respective redistribution of material of the layer 213 may be considered appropriate. In the embodiment shown, prior to and/or after exposure of the surface of the metal region 212, a further treatment 207 may be performed in order to introduce a desired material species at the bottom of the via 221A. For this purpose, the treatment 207 may comprise a process, for instance for incorporating a species, such as nitrogen, silicon, oxygen and the like, in order to adjust the characteristics of the material 212P and redistribute in a subsequent manufacturing stage. For example, by incorporating an appropriate species, such as nitrogen and the like, the overall etch resistance with respect to a subsequent wet chemical etch process, such as the process 215 (FIG. 2*d*), may be adjusted, thereby allowing a reduced layer thickness for the protective material 212P. In other illustrative embodiments, depending on the overall process strategy, an ion implantation process may be performed so as to locally provide a respective species, such as aluminum and the like, in order to enhance the overall characteristics of the material 212P. In this case, the corresponding implantation process may be performed on the basis of an etch mask for defining the via opening 221A, while the trench 221B may not yet have been formed.

FIG. 2*h* schematically illustrates the semiconductor device 200 during the process 206B for redistributing material for the region 212 in combination with the previously introduced material species. In some illustrative embodiments, the process 206B may represent a sputter etch process, which may be performed on the basis of well-established process parameters, as may also be used during a re-sputter process, which may frequently be used in combination with the deposition of a conductive barrier material, such as the material 222B (FIGS. 2e-2f). In some illustrative embodiments, the removal of the surface 212C, during the process 206B may be less critical, since any residues or any intentional maintain layer portions may provide enhanced etch resistivity during the cleaning process 215 and may be removed during an initial phase for forming the barrier layer 222B on the basis of a starter deposition process. Thereafter, further processing may be continued, as described above.

As a result, the present disclosure provides techniques and corresponding semiconductor devices, in which the creation of irregularities or voids in a conductive cap material may be significantly reduced by forming a protective material by means of material redistribution at the via bottom prior to performing a wet chemical cleaning process. Hence, a highly efficient overall process flow may be established while nevertheless providing a high degree of compatibility with conventional strategies or providing enhanced cycle time with respect to conventional techniques, in which a further re-deposition of the cap material may be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
    a metal region formed in a first dielectric layer;
    a conductive cap layer formed on at least a portion of said metal region;
    a via extending through a second dielectric layer and through said conductive cap layer;
    a protective material formed on sidewall portions of said conductive cap layer in said via; and
    a conductive barrier layer formed on said protective material and on surface portions of said second dielectric layer within said via.

2. The semiconductor device of claim 1, further comprising a dielectric etch stop layer formed between said conductive cap layer and said second dielectric layer, wherein said via extends through said etch stop layer.

3. The semiconductor device of claim 2, wherein said protective material covers a lower portion of sidewalls of said etch stop layer within said via.

4. The semiconductor device of claim 3, wherein an upper sidewall portion of said etch stop layer is not covered by said protective material.

5. The semiconductor device of claim 1, wherein said protective material comprises material of substantially the same composition as material of said metal region.

6. The semiconductor device of claim 1, wherein said protective material comprises material other than material of said metal region, said conductive cap layer and said conductive barrier layer.

7. The semiconductor device of claim 1, wherein said conductive cap layer comprises at least one of cobalt, tungsten and phosphorous.

8. The semiconductor device of claim 1, further comprising a transistor element having at least one lateral dimension of approximately 50 nm or less.

* * * * *